US009570263B2

(12) United States Patent
Parashar

(10) Patent No.: US 9,570,263 B2
(45) Date of Patent: Feb. 14, 2017

(54) VACUUM SWITCHING ASSEMBLY

(71) Applicant: Supergrid Institute SAS, Villeurbanne (FR)

(72) Inventor: Rama Shanker Parashar, Stafford (GB)

(73) Assignee: Supergrid Institute SAS, Villeurbanne (FR)

( * ) Notice: Subject to any disclaimer, the term of this patent is extended or adjusted under 35 U.S.C. 154(b) by 0 days.

(21) Appl. No.: 14/897,018

(22) PCT Filed: Jun. 11, 2013

(86) PCT No.: PCT/EP2013/062047
§ 371 (c)(1),
(2) Date: Dec. 9, 2015

(87) PCT Pub. No.: WO2014/198301
PCT Pub. Date: Dec. 18, 2014

(65) Prior Publication Data
US 2016/0126050 A1 May 5, 2016

(51) Int. Cl.
*H01J 17/26* (2012.01)
*H01J 17/22* (2012.01)
(Continued)

(52) U.S. Cl.
CPC ................ *H01J 17/22* (2013.01); *H01J 17/04* (2013.01); *H01J 17/14* (2013.01); *H01J 17/26* (2013.01); *H01J 17/44* (2013.01); *H01H 33/596* (2013.01)

(58) Field of Classification Search
CPC ............ H01J 41/04; H01J 41/20; H01J 41/02; H01J 61/72; H01J 61/28; H01J 61/24
(Continued)

(56) References Cited

U.S. PATENT DOCUMENTS 3,643,047 A 2/1972 Rich
3,696,264 A 10/1972 Clark, Jr. et al.
(Continued)

FOREIGN PATENT DOCUMENTS

DE 3721529 A1 1/1989
EP 0 079 181 5/1983
(Continued)

OTHER PUBLICATIONS

International Search Report from corresponding PCT Application No. PCT/EP2013/062047 dated Feb. 6, 2014, pp. 1-3.

*Primary Examiner* — Minh D A
(74) *Attorney, Agent, or Firm* — Brinks Gilson & Lione

(57) ABSTRACT

There is provided a vacuum switching assembly for switching an AC or DC current. The vacuum switching assembly comprises a vacuum switch. The vacuum switch includes: first and second electrodes (20, 22) located in a vacuum tight enclosure, the vacuum tight enclosure containing a gas or gas mixture, the first and second electrodes (20, 22) defining opposed electrodes being separated by a gap, each of the first and second electrodes (20,22) being connectable to a respective electrical circuit carrying an AC or DC voltage; and a pressure controller (36) configured to control an internal pressure of the vacuum tight enclosure, wherein the pressure controller (36) is configured to selectively switch the internal pressure of the vacuum tight enclosure between: a first vacuum level that permits formation and maintenance of a glow discharge in the vacuum tight enclosure to allow a current to flow between the first and second electrodes (20, 22) via the glow discharge so as to turn on the vacuum switch; and a second vacuum level that inhibits formation and maintenance of a glow discharge in the vacuum tight enclosure to prevent a current from flowing between the first
(Continued)

and second electrodes (20, 22) via the glow discharge so as to turn off the vacuum switch.

20 Claims, 4 Drawing Sheets

(51) Int. Cl.

| | |
|---|---|
| ***H01J 17/44*** | (2006.01) |
| ***H01J 17/04*** | (2012.01) |
| ***H01J 17/14*** | (2006.01) |
| *H01H 33/59* | (2006.01) |

(58) Field of Classification Search
USPC ......... 315/108, 109, 110; 313/550, 551, 552
See application file for complete search history.

(56) References Cited

U.S. PATENT DOCUMENTS

| | | | |
|---|---|---|---|
| 3,876,905 A | 4/1975 | Lutz et al. | |
| 3,997,748 A | 12/1976 | Harris | |
| 4,063,126 A | 12/1977 | Rich et al. | |
| 4,086,459 A | 4/1978 | Rich | |
| 4,126,808 A | 11/1978 | Rich | |
| 4,130,781 A | 12/1978 | Dethlefsen | |
| 4,192,981 A | 3/1980 | Barkan et al. | |
| 4,224,550 A | 9/1980 | Rich | |
| 4,890,040 A | 12/1989 | Gundersen | |
| 5,091,819 A | 2/1992 | Christiansen et al. | |
| 5,329,205 A | 7/1994 | Goebel et al. | |
| 5,336,975 A | 8/1994 | Goebel et al. | |
| 6,465,051 B1 * | 10/2002 | Sahin | C23C 16/4405 118/723 E |
| 2012/0145674 A1 * | 6/2012 | Schellekens | H01H 9/54 218/122 |

FOREIGN PATENT DOCUMENTS

| | | |
|---|---|---|
| EP | 2 736 059 A1 | 5/2014 |
| EP | 2 736 060 A1 | 5/2014 |
| EP | 2 736 061 A1 | 5/2014 |
| GB | 295031 | 8/1927 |
| WO | WO 2012/159669 A1 | 11/2012 |
| WO | WO 2012/167818 A1 | 12/2012 |

* cited by examiner

VACUUM SWITCHING ASSEMBLY

CROSS-REFERENCE TO RELATED APPLICATIONS

This application is a National Stage application of International Application No. PCT/EP2013/062047, filed Jun. 11, 2013, titled "Vacuum Switching Assembly," which is hereby incorporated by reference in its entirety.

TECHNICAL FIELD

This invention relates to a vacuum switching assembly and a power switching apparatus.

BACKGROUND

The operation of multi-terminal high voltage direct current (HVDC) transmission and distribution networks involves load and fault/short-circuit current switching operations. The availability of switching components to perform such switching permits flexibility in the planning and design of HVDC applications such as parallel HVDC lines with a tap-off line or a closed loop circuit.

A known solution for load and fault/short-circuit current switching is the use of semiconductor-based switches, which are typically used in point-to-point high power HVDC transmission. The use of semiconductor-based switches results in faster switching and smaller values of let-through fault current. The disadvantages of using such switches however include high forward losses, sensitivity to transients and the lack of tangible isolation when the devices are in their off-state.

Another known solution for load and fault/short-circuit current switching is a vacuum interrupter. The operation of the vacuum interrupter relies on the mechanical separation of electrically conductive electrodes to open the associated electrical circuit. Such a vacuum interrupter is capable of allowing high magnitude of continuous AC current with a high short-circuit current interrupting capability.

The conventional vacuum interrupter however exhibits poor performance in interrupting DC current because of the absence of current zero. Although it is feasible to use the conventional vacuum interrupter to interrupt low DC currents up to a few hundred amperes due to the instability of an arc at low currents, such a method is not only unreliable but is also incompatible with the levels of current typically found in HVDC applications.

DETAILED DESCRIPTION

Figure 1:
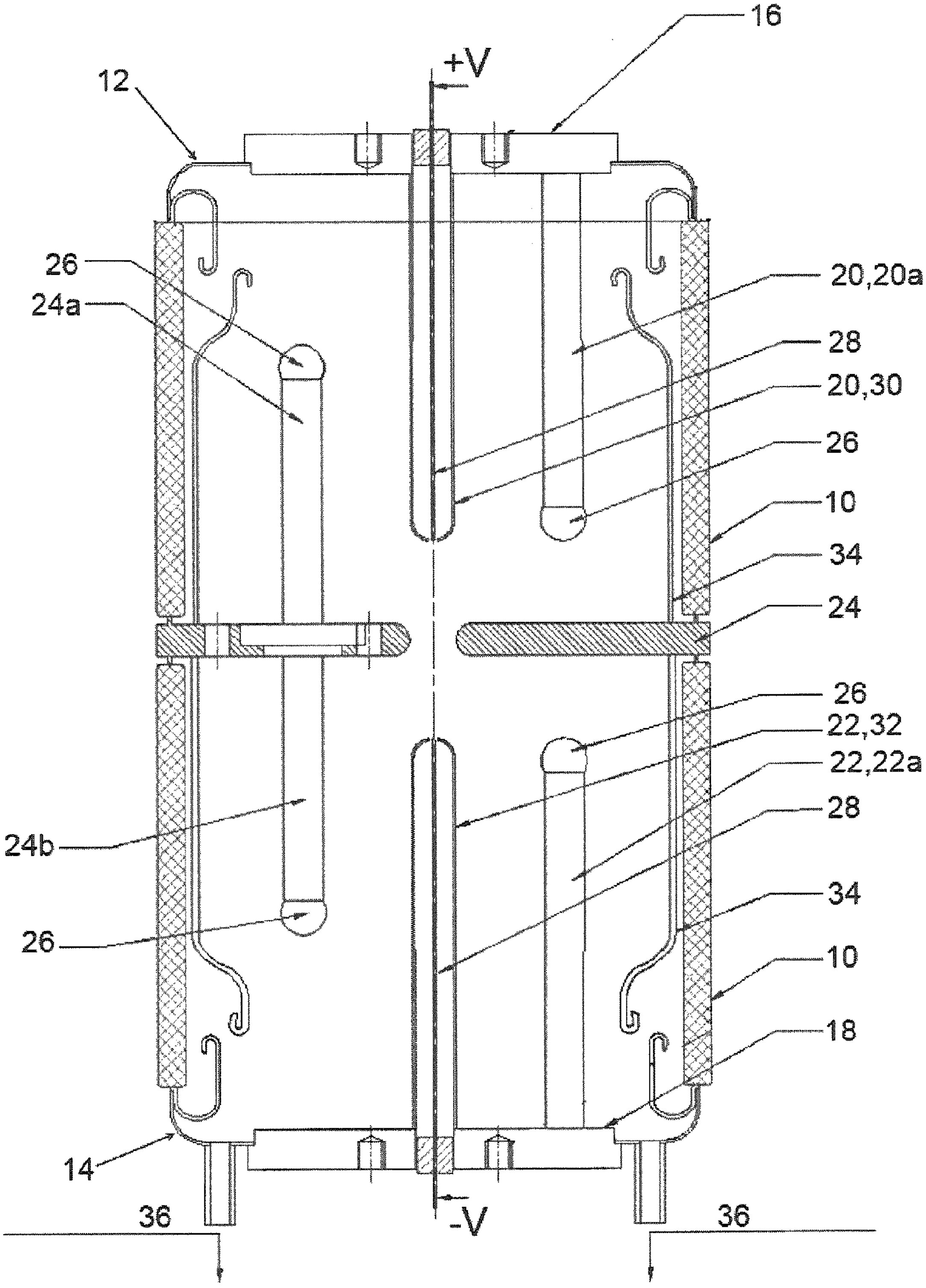
FIG. 1 shows a vacuum switch forming part of a vacuum switching assembly according to a first embodiment of the invention.

It is possible to carry out DC current interruption using conventional vacuum interrupters by applying a forced current zero or artificially creating a current zero. This method of DC current interruption involves connecting an auxiliary circuit in parallel across the conventional vacuum interrupter, the auxiliary circuit comprising a capacitor, a combination of a capacitor and an inductor or any other oscillatory circuit. The auxiliary circuit remains isolated by a spark gap during normal operation of the vacuum interrupter.

When the electrodes of the vacuum interrupter begin to separate, the spark ignition gap is switched on to introduce an oscillatory current of sufficient magnitude across the vacuum interrupter and thereby force the current across the interrupter to pass through a current zero. This allows the vacuum interrupter to successfully interrupt the DC current. Such an arrangement however becomes complex, costly and space consuming due to the need to integrate the additional components of the auxiliary circuit.

In addition the electrodes of the vacuum interrupter are required to be separated by a predefined gap to enable the vacuum interrupter to successfully interrupt the DC current. This means that the responsiveness of the vacuum interrupter is limited by the movement speed of one or each of the electrodes during formation of the predefined gap between the electrodes.

Furthermore separation of the electrodes results in generation of a metal vapour arc that can modify or damage the surfaces of the electrodes. This in turn can cause the dielectric behaviour of the vacuum interrupter to fluctuate throughout the lifetime of the vacuum interrupter, thus resulting in an unreliable vacuum interrupter.

According to a first aspect of the invention, there is provided a vacuum switching assembly for switching an AC or DC current, the vacuum switching assembly comprising a vacuum switch, the vacuum switch including:

first and second electrodes located in a vacuum tight enclosure, the vacuum tight enclosure containing a gas or gas mixture, the first and second electrodes defining opposed electrodes being separated by a gap, each of the first and second electrodes being connectable to a respective electrical circuit carrying an AC or DC voltage; and a pressure controller configured to control an internal pressure of the vacuum tight enclosure, wherein the pressure controller is configured to selectively switch the internal pressure of the vacuum tight enclosure between:

- a first vacuum level that permits formation and maintenance of a glow discharge in the vacuum tight enclosure to allow a current to flow between the first and second electrodes via the glow discharge so as to turn on the vacuum switch; and
- a second vacuum level that inhibits formation and maintenance of a glow discharge in the vacuum tight enclosure to prevent a current from flowing between the first and second electrodes via the glow discharge so as to turn off the vacuum switch.

The gas in the vacuum tight enclosure may be, but is not limited to, hydrogen, nitrogen, argon, helium, neon, xenon, compounds thereof, or $SF_6$. Similarly the gas mixture in the vacuum tight enclosure may include, but is not limited to, hydrogen, nitrogen, argon, helium, neon, xenon, compounds thereof, and/or $SF_6$.

The second vacuum level may have a lower or higher pressure value than the first vacuum level.

The configuration of the pressure controller may vary to enable it to control the internal pressure of the vacuum tight enclosure. For example, the pressure controller may include: a pumping apparatus configured to selectively remove at least a portion of the gas or gas mixture from the vacuum tight enclosure; and/or a venting apparatus or mass flow controller configured to selectively introduce a gas or gas mixture into the vacuum tight enclosure.

In use, each of the first and second electrodes is connected to a respective electrical circuit carrying an AC or DC voltage. Thus, a differential voltage appears between the first and second electrodes when the vacuum switch is turned off, and a current flows between the first and second electrodes when the vacuum switch is turned on.

To turn on the vacuum switch, the pressure controller switches the internal pressure of the vacuum tight enclosure from the second vacuum level to the first vacuum level, which has a higher or lower pressure value than the second vacuum level. This increases or decreases the density of the gas or gas mixture in the vacuum tight enclosure to a level that permits formation of a glow discharge in the vacuum tight enclosure.

The glow discharge is then formed by passing a current through the gas or gas mixture so as to ionise the gas or gas mixture. To enable formation of the glow discharge in the vacuum tight enclosure, the vacuum switch may be configured as follows.

In embodiments of the invention, the vacuum switch may further include a first trigger electrode spaced apart from the first electrode and/or a second trigger electrode spaced apart from the second electrode, and the vacuum switch may further include a first voltage controller configured to control the voltage of the or each trigger electrode, the first voltage controller being configured to selectively generate a differential voltage between the or each trigger electrode and the corresponding one of the first and second electrodes so as to ionise the gas or gas mixture and thereby form the glow discharge in the vacuum tight enclosure.

During the switching of the internal pressure of the vacuum tight enclosure from the second vacuum level to the first vacuum level, electrical breakdown between the first and second electrodes may occur, thereby resulting in formation of an electrical breakdown-induced arc discharge that could damage or modify the surfaces of the electrodes.

The first voltage controller may be further configured to selectively generate a differential voltage between the or each trigger electrode and the corresponding one of the first and second electrodes so as to ionise the gas or gas mixture and thereby form the glow discharge in the vacuum tight enclosure prior to the internal pressure of the vacuum tight enclosure reaching a vacuum level that permits formation of an electrical breakdown-induced arc discharge, when the internal pressure of the vacuum tight enclosure is switched from the second vacuum level to the first vacuum level. This ensures that the switching of the internal pressure of the vacuum tight enclosure from the second vacuum level to the first vacuum level does not result in formation of an electrical breakdown-induced arc discharge.

In further embodiments of the invention, the vacuum switch may further include a second voltage controller configured to selectively generate a differential voltage between the first and second electrodes so as to ionise the gas or gas mixture and thereby form the glow discharge in the vacuum tight enclosure.

Following formation of the glow discharge in the vacuum tight enclosure, the glow discharge provides a path for current to flow between the first and second electrodes. In this manner the vacuum switch is turned on. Controlling the internal pressure of the vacuum tight enclosure at the first vacuum level permits maintenance of the glow discharge in the vacuum tight enclosure and thereby enables the vacuum switch to remain turned on.

Unlike the metal vapour arc, the glow discharge does not modify or damage the surfaces of the electrodes, thus enabling the vacuum switch to provide a consistent dielectric behaviour throughout the lifetime of the vacuum switch.

Preferably the first vacuum level is in the range of 0.01 to 0.1 Torr. It will be appreciated however that, in other embodiments of the invention, the pressure value of the first vacuum level may vary as long as it permits formation and maintenance of a glow discharge in the vacuum tight enclosure to allow a current to flow between the first and second electrodes via the glow discharge.

Optionally the first vacuum level may correspond to a Paschen minimum state of the gas or gas mixture. At the Paschen minimum state of the gas or gas mixture, the dielectric strength between the first and second electrodes is at its minimum. This enables the voltage drop across the first and second electrodes to be kept at a minimum and thereby minimise energy dissipation across the surfaces of the electrodes while the vacuum switch is turned on.

The voltage drop across the first and second electrodes during turn-on of the vacuum switch varies with the type of gas or gas mixture in the vacuum tight enclosure. Accordingly the gas or gas mixture may be selected to minimise a voltage that appears across the first and second electrodes when the vacuum switch is turned on at the first vacuum level of the internal pressure of the vacuum tight enclosure.

To turn off the vacuum switch, the pressure controller switches the internal pressure of the vacuum tight enclosure from the first vacuum level to the second vacuum level, which has a lower or higher pressure value than the first vacuum level. This decreases or increases the density of the gas or gas mixture in the vacuum tight enclosure to a level that inhibits maintenance of the glow discharge in the vacuum tight enclosure. Consequently the glow discharge is extinguished, thus removing the path for current to flow between the first and second electrodes. In this manner the vacuum switch is turned off. Controlling the internal pressure of the vacuum tight enclosure at the second vacuum level inhibits formation of a new glow discharge in the vacuum tight enclosure and thereby enables the vacuum switch to remain turned off.

The inclusion of the pressure controller in the vacuum switch therefore results in a vacuum switching assembly that is capable of switching AC and DC currents without the use of moving electrodes and without the need for a metal vapour arc between the electrodes, thus obviating the earlier-mentioned problems associated with separation of electrodes during switching of the conventional vacuum interrupter. The vacuum switching assembly according to the invention may form part of a power switching apparatus.

In embodiments of the invention, the pressure controller may be configured to selectively vary the rate of change of the internal gas pressure of the vacuum tight enclosure between the first and second vacuum levels so as to vary the rate of turn-on or turn-off of the vacuum switch. This allows the pressure controller to not only control the rate of change of recovery voltage across the first and second electrodes, but also control the rate of change of the internal gas pressure of the vacuum tight enclosure between the first and second vacuum levels to inhibit generation of voltage transients, thus obviating the need for the addition of a surge arrester to handle any voltage transient.

In further embodiments of the invention, the pressure controller may be configured to vary the internal pressure of the vacuum tight enclosure within a range of vacuum levels, each of which permits formation and maintenance of a glow discharge in the vacuum tight enclosure to allow a current to flow between the first and second electrodes via the glow discharge, while the vacuum switch is turned on. This allows the pressure controller to not only actively vary the current density in the vacuum switch, but also actively vary the voltage across the first and second electrodes, thus enabling the vacuum switch to be operated as a power flow controller to control the rate of change of current in the electrical circuits connected to the first and second electrodes.

Preferably the first and second electrodes are separated by a fixed gap. It will be appreciated however that either or each of the first and second electrodes may be configured to be capable of movement in order to increase or decrease the gap between the first and second electrodes, even though turn-on and turn-off of the vacuum switch does not require movement of the first and second electrodes.

The shape and arrangement of the first and second electrodes may vary depending on the requirements of the associated power application.

In embodiments of the invention, the first and second electrodes may be shaped and arranged to define any one of:

a pair of cylindrically concentric electrodes;

a pair of parallel plate electrodes;

a pair of spherically concentric electrodes.

In other embodiments of the invention, the first electrode may include a plurality of first elongate sub-electrodes, the second electrode may include a plurality of second elongate sub-electrodes, and the vacuum switch may further include an auxiliary electrode arranged between and spaced apart from the first and second electrodes inside the vacuum tight enclosure, the auxiliary electrode including a plurality of third elongate sub-electrodes and a plurality of fourth elongate sub-electrodes, each sub-electrode extending parallelly with a longitudinal axis extending through the first and second electrodes, each plurality of elongate sub-electrodes being radially arranged about the longitudinal axis extending through the first and second electrodes, each first elongate sub-electrode being arranged between and spaced apart from two third elongate sub-electrodes to define an interleaved radial array of alternating first and third elongate sub-electrodes, each second elongate sub-electrode being arranged between and spaced apart from two fourth elongate sub-electrodes to define an interleaved radial array of alternating second and fourth elongate sub-electrodes.

In use, the auxiliary electrode may be kept at a floating potential, whilst each of the first and second electrodes is connected to a respective electrical circuit carrying an AC or DC voltage. When the vacuum switch is turned on, current flows between the first and second electrodes via the auxiliary electrode and the glow discharge between the sub-electrodes of the interleaved radial arrays. When the vacuum switch is turned off, the glow discharge between the sub-electrodes of the interleaved radial arrays is extinguished, thereby preventing current from flowing between the first and second electrodes.

The inclusion of the auxiliary electrode in the vacuum switch not only increases the effective gap between the first and second electrodes and thereby increases the dielectric withstand capability of the device, but also supports excellent dielectric recovery subsequent to the turn-off of the vacuum switch.

In such embodiments of the invention in which the vacuum switch includes the first trigger electrode and/or the second trigger electrode, either or each of the first and second electrodes may include a tubular elongate sub-electrode coaxially arranged with the longitudinal axis extending through the first and second electrodes, the tubular elongate sub-electrode being configured to house the corresponding trigger electrode and to be spaced apart from the corresponding trigger electrode.

The arrangement of the vacuum switch in this manner enables the glow discharge to be initially formed in a central location relative to the sub-electrodes of the interleaved radial arrays, thus facilitating a more uniform expansion of the glow discharge among the sub-electrodes of the interleaved radial arrays. This in turn provides a more uniform path for current to flow between the first and second electrodes and thereby results in dependable turn-on behaviour of the vacuum switch, thus improving the reliability of the vacuum switching assembly.

In embodiments of the invention employing the use of elongate sub-electrodes, each elongate sub-electrode includes a rod portion and an end portion located at a free end of the rod portion.

It has been established that, when the end and rod portions of each elongate sub-electrode have the same diameter, the current density is higher at the end portion than along the rod portion.

Each end portion may be shaped to be partially or wholly spherical, and each end portion having a larger diameter than the corresponding rod portion. The configuration of each end in this manner increases the surface area of the corresponding sub-electrode in a manner that leads to more uniform distribution of the glow discharge across the surface of the elongate sub-electrode and of the current density across each interleaved radial array. This improves the current interrupting capability, high voltage withstand capability and dielectric recovery of the vacuum switch.

In further embodiments of the invention employing the use of elongate sub-electrodes, at least part of each elongate sub-electrode may be coated with, attached to or joined to with refractory material. The refractory material may be selected from, but not limited to, a group of, for example, copper-chromium, copper-tungsten, copper tungsten carbide, tungsten, chromium or molybdenum. Each end portion may be made of a refractory material, which may be selected from, but not limited to, a group of, for example, copper-chromium, copper-tungsten, copper tungsten carbide, tungsten, chromium or molybdenum. These refractory materials not only exhibit excellent electrical conductivity, but also display high dielectric strength subsequent to the use of the vacuum switch to interrupt current.

When the vacuum switch is required to switch a high current, the resultant magnetic force acting on the electrodes may become strong enough to cause deformation of the electrodes. Each electrode may include at least one structural reinforcement element arranged to inhibit deformation of the electrode caused by a magnetic force induced by a magnetic field generated during flow of current in the electrode. For example, the or each structural reinforcement element in each electrode may be a non-magnetic steel insert placed inside the electrode, preferably along its longitudinal axis, or may be a steel tube joined (e.g. brazed) to a support structure that is associated with the electrode and extends outside the vacuum tight enclosure.

The vacuum switching assembly may further include a magnetic field generator located outside the vacuum tight enclosure, the magnetic field generator being arranged with respect to the vacuum tight enclosure to enable the magnetic field generator to generate a magnetic field with a magnetic field direction that is transverse to an electric field direction in the glow discharge.

The generation of a magnetic field with a magnetic field direction that is transverse to an electric field direction in the glow discharge assists the rise in voltage of the glow discharge. Thus, application of the magnetic field at the instant of a current zero in the vacuum switch speeds up dielectric recovery subsequent to the turn-off of the vacuum switch.

The number and arrangement of vacuum switches in the vacuum switching assembly may vary, depending on the design requirements of the vacuum switching assembly. The vacuum switching assembly may, for example, include a plurality of series-connected and/or parallel-connected vacuum switches. Multiple vacuum switches may be connected to define different configurations of the vacuum switching assembly in order to vary its operating voltage and current characteristics to match the requirements of the associated power application.

While the vacuum switch is turned on, the voltage drop across the first and second electrodes results in generation of heat losses that distribute rapidly via the glow discharge to components of the vacuum switch. A heat removal apparatus is therefore required to remove these heat losses and thereby maintain the temperature of the vacuum switch within permissible limits. For example, the gas or gas mixture may be circulated through a heat exchanger to remove the heat losses.

According to a second aspect of the invention, there is provided a power switching apparatus for switching an AC or DC current, the power switching apparatus comprising:

a vacuum switching assembly according to any embodiment of the first aspect of the invention; and a mechanical switching assembly connected in parallel with the vacuum switching assembly between a pair of terminals, each of the terminals being connectable to a respective electrical circuit carrying an AC or DC voltage, the mechanical switching assembly including at least one mechanical switch.

In use, during normal operation of the electrical circuits, the or each vacuum switch in the vacuum switching assembly is turned off while the or each mechanical switch in the mechanical switching assembly is closed to conduct a current flowing between the two terminals. This not only results in an overall reduction in heat losses in comparison to the vacuum switching assembly, but also obviates the need for the aforementioned heat removal apparatus.

The power switching apparatus is turned off as follows. Initially the or each mechanical switch is opened, thus forming an arc therein. Once a sufficiently large arc voltage has developed in the or each mechanical switch, the or each vacuum switch is turned on to divert the current from the mechanical switching assembly to the vacuum switching assembly, thereby extinguishing the arc in the or each mechanical switch and fully opening the or each mechanical switch with full dielectric recovery. The or each vacuum switch is then turned off to complete the turn-off of the power switching apparatus.

The power switching apparatus is turned on as follows. Initially the or each vacuum switch is turned on. The or each mechanical switch is then closed. Once the or each mechanical switch is fully closed and thereby carrying the current flowing between the terminals, the or each vacuum switch is turned off to complete the turn-on of the power switching apparatus.

Examples of applications that are compatible with the vacuum switching assembly and power switching apparatus according to the invention include, for example, AC power networks, AC and DC high voltage circuit breakers, network power flow control, AC generator circuit breakers, transmission lines, railway traction, ships, superconducting magnetic storage devices, high energy fusion reactor experiments, stationary power applications, renewable energy resources such as fuel cells and photovoltaic cells and high voltage direct current (HVDC) multi-terminal networks.

Figure 2:
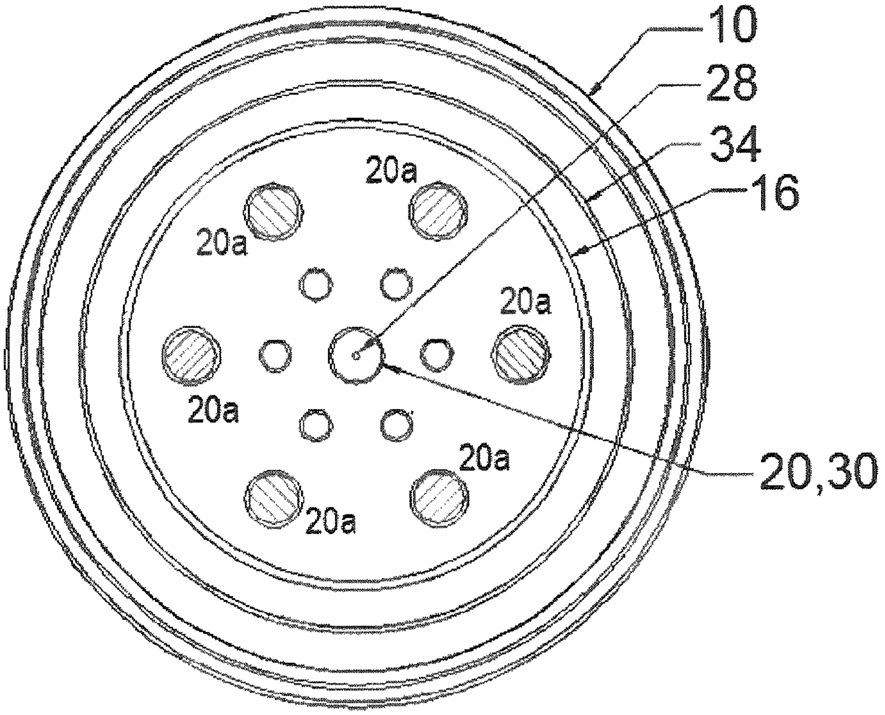
FIG. 2 shows a cross-sectional view of the vacuum switch of FIG. 1.
Figure 3:
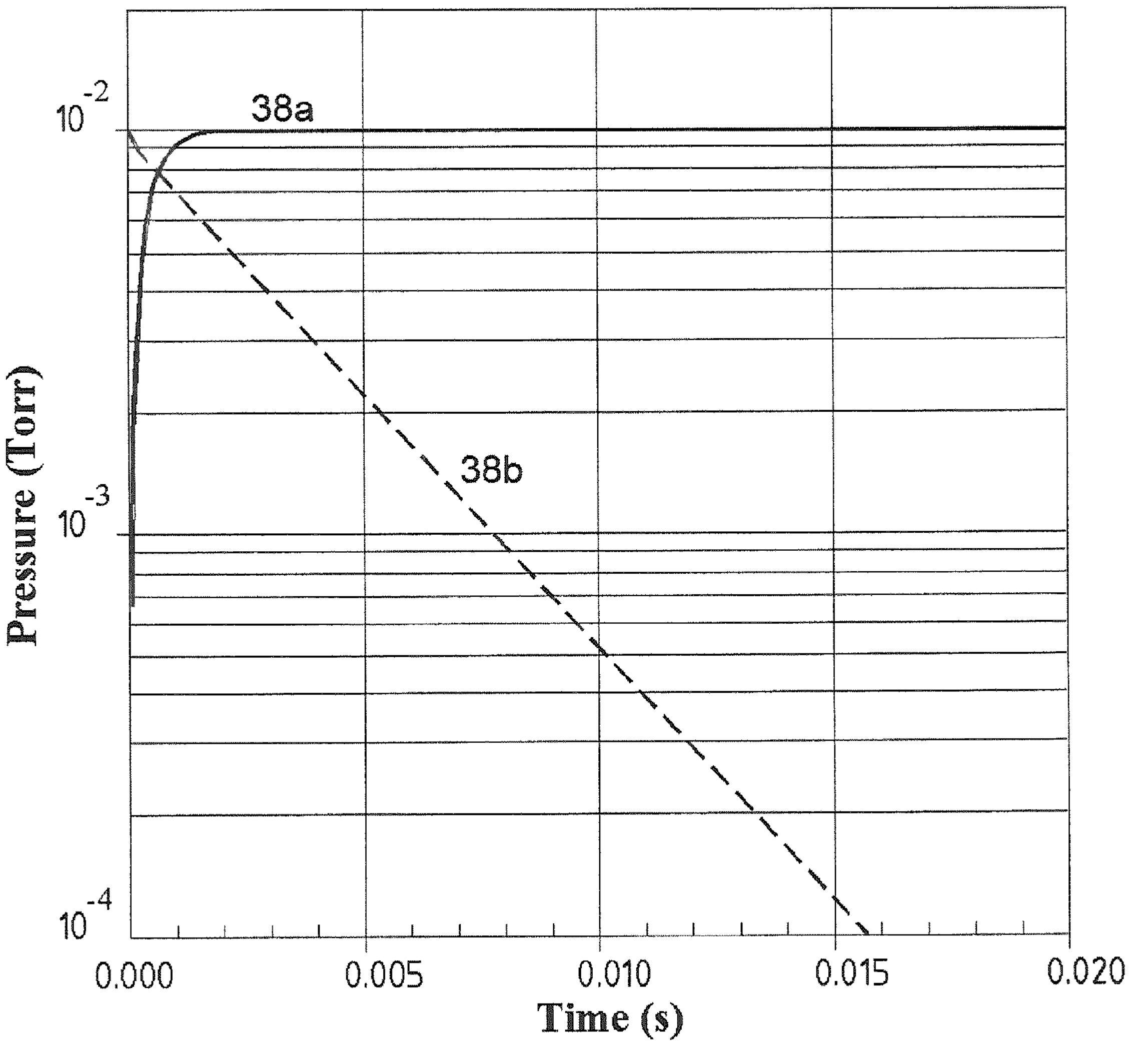
FIG. 3 illustrates, in graph form, the operation of a pressure controller to control the internal pressure of a vacuum tight enclosure forming part of the vacuum switch of FIG. 1.
Figure 4:
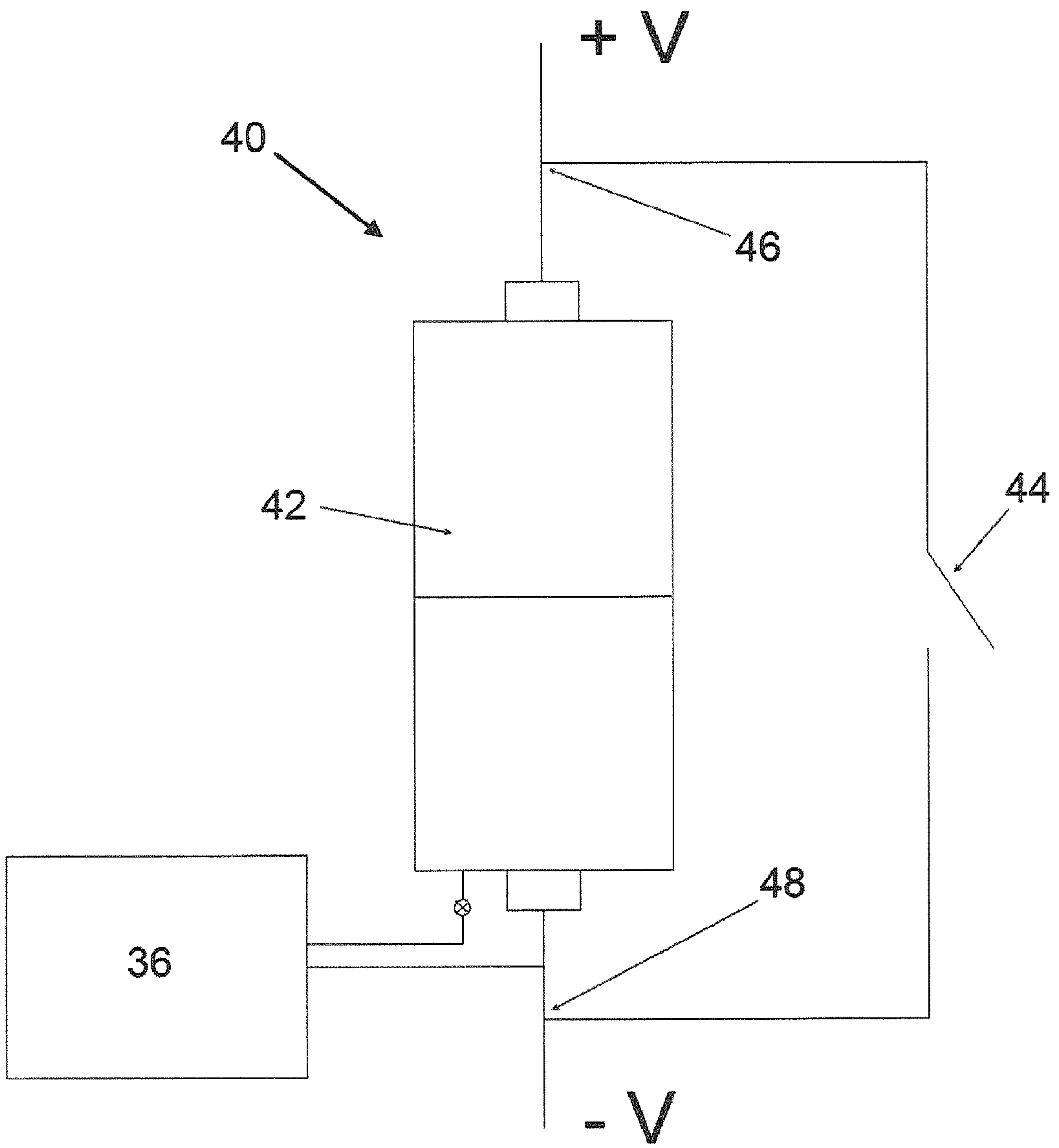
FIG. 4 shows a power switching apparatus according to a second embodiment of the invention.

Preferred embodiments of the invention will now be described, by way of non-limiting examples only, with reference to the accompanying drawings in which:

FIG. 1 shows a vacuum switch forming part of a vacuum switching assembly according to a first embodiment of the invention;

FIG. 2 shows a cross-sectional view of the vacuum switch of FIG. 1;

FIG. 3 illustrate, in graph form, the operation of a pressure controller to control the internal pressure of a vacuum tight enclosure forming part of the vacuum switch of FIG. 1; and FIG. 4 shows a power switching apparatus according to a second embodiment of the invention.

A vacuum switching assembly for switching a DC current according to a first embodiment of the invention comprises a vacuum switch, which is shown in FIG. 1.

The vacuum switching assembly includes a single vacuum switch.

The vacuum switch includes a pair of alumina ceramic cylindrical housings 10, a first end flange 12 and a second end flange 14 assembled to define a vacuum tight enclosure. Each end flange 12,14 is brazed to a respective one of the cylindrical housings 10 to form a hermetic joint. The first and second end flanges 12,14 are located at opposite ends of the vacuum switch.

Each cylindrical housing 10 is metallised and nickel-plated at both ends. The length and diameter of the respective cylindrical housing 10 varies depending on the operating voltage rating of the vacuum switch, while the dimensions and shape of the first and second end flanges 12,14 may vary to correspond to the size and shape of the respective cylindrical housing 10.

The vacuum tight enclosure contains a gas. The gas in the vacuum tight enclosure may be, but is not limited to, hydrogen, nitrogen, argon, helium, neon, xenon, compounds thereof, or $SF_6$. It is envisaged that, in other embodiments of the invention, the gas may be replaced by a gas mixture that may include, but is not limited to, hydrogen, nitrogen, argon, helium, neon, xenon, compounds thereof, and/or $SF_6$.

The vacuum switch further includes electrically conductive first and second end plates 16,18.

The first end plate 16 is retained within a hollow bore of the first end flange 12 while the second end plate 18 is retained within a hollow bore of the second end flange 14, such that a first face of each end plate 16,18 defines an inner wall of the vacuum tight enclosure and a second face of each end plate 16,18 defines an outer wall of the vacuum tight enclosure.

The vacuum switch further includes first, second and auxiliary electrodes 20, 22, 24.

The first electrode 20 includes a plurality of first elongate sub-electrodes 20*a*, each of which extends from the first face of the first end plate 16 into the vacuum tight enclosure. The second electrode 22 includes a plurality of second elongate sub-electrodes 22*a*, each of which extends from the first face of the second end plate 18 into the vacuum tight enclosure.

The auxiliary electrode 24 is mounted between the cylindrical housings 10 such that the auxiliary electrode 24 is arranged between and spaced apart from the first and second electrodes 20,22 inside the vacuum tight enclosure. The auxiliary electrode 24 includes a plurality of third elongate sub-electrodes 24*a* and a plurality of fourth elongate sub-electrodes 24*b*. The auxiliary electrode further includes a first face, which faces the first face of the first end plate 16, and a second face, which faces the first face of the second end plate 18. The plurality of third elongate sub-electrodes 24*a* extends from the first face of the auxiliary electrode 24, while the plurality of fourth elongate sub-electrodes 24*b* extends from the second face of the auxiliary electrode 24.

Each elongate sub-electrode 20*a*, 22*a*, 24*a*, 24*b* extends parallelly with a longitudinal axis extending through the first and second electrodes 20,22. Each plurality of elongate sub-electrodes 20*a*, 22*a*, 24*a*, 24*b* is radially arranged about the longitudinal axis extending through the first and second electrodes 20,22. Each first elongate sub-electrode 20*a* is arranged between and spaced apart from two third elongate sub-electrodes 24*a* to define an interleaved radial array of alternating first and third elongate sub-electrodes 20*a*,24*a*, as shown in FIG. 2, and each second elongate sub-electrode 22*a* is arranged between and spaced apart from two fourth elongate sub-electrodes 24*b* to define an interleaved radial array of alternating second and fourth elongate sub-electrodes 22*a*,24*b*.

Each elongate sub-electrode 20*a*, 22*a*, 24*a*, 24*b* has a fixed position, i.e. it cannot be moved. Therefore, there is a fixed gap between each first elongate sub-electrode 20*a* and each of the neighbouring third elongate sub-electrodes 24*a* and there is a fixed gap between each second elongate sub-electrode 22*a* and each of the neighbouring fourth elongate sub-electrodes 24*b*. This means that the first and second electrodes 20,22 are separated by a fixed, effective gap resulting from the arrangement of the interleaved radial arrays of the elongate sub-electrodes 20*a*, 22*a*, 24*a*, 24*b* of the first, second and auxiliary electrodes 20, 22, 24. The inclusion of the auxiliary electrode 24 in the vacuum switch not only increases the effective gap between the first and second electrodes 20,22 and thereby increases the dielectric withstand capability of the vacuum switch, but also supports excellent dielectric recovery subsequent to the turn-off of the vacuum switch.

Each elongate sub-electrode 20*a*, 22*a*, 24*a*, 24*b* includes a rod portion and an end portion 26 located at a free end of the rod portion. Each end portion 26 is shaped to be partially spherical. Each end portion 26 has a larger diameter than the corresponding rod portion. In other embodiments of the invention, it is envisaged that each end portion may be shaped to be wholly spherical.

Each end plate 16,18 and electrode 20, 22, 24 is fabricated from oxygen-free high conductivity (OFHC) copper. Each sub-electrode 20*a*, 22*a*, 24*a*, 24*b* may optionally be coated with, attached to or joined to a refractory material, which may be selected from a group of, for example, copper-chromium, copper-tungsten, copper tungsten carbide, tungsten, chromium or molybdenum. Each end portion 26 may optionally be made of a refractory material, which may be selected from a group of, for example, copper-chromium, copper-tungsten, copper tungsten carbide, tungsten, chromium or molybdenum. These refractory materials not only exhibit excellent electrical conductivity, but also display high dielectric strength subsequent to the use of the vacuum switch to interrupt a DC current.

The vacuum switch further includes first and second trigger electrodes 28, and a first voltage controller. The first electrode further includes a first tubular elongate sub-electrode 30 extending from the first face of the first end plate 16 into the vacuum tight enclosure, and the second electrode further includes a second tubular elongate sub-electrode 32 extending from the first face of the second end plate 18 into the vacuum tight enclosure. Each tubular elongate sub-electrode 30,32 is coaxially arranged with the longitudinal axis extending through the first and second electrodes 20,22. Each tubular elongate sub-electrode 30,32 is configured to house the corresponding trigger electrode 28 and to be spaced apart from the corresponding trigger electrode 28 via a ceramic spacer.

In use, each trigger electrode 28 is connected to a voltage source. The first voltage controller is configured to selectively generate a differential voltage between each trigger electrode 28 and the corresponding one of the first and second electrodes 20,22 so as to ionise the gas and thereby form a glow discharge in the vacuum tight enclosure.

The inner walls of the cylindrical housings 10 are protected from the glow discharge by a central shield 34 that overlaps inner walls of the cylindrical housings 10.

The vacuum tight enclosure has an internal volume of 1 liter and an internal surface area of 2000 $cm^2$. The vacuum switch further includes a pressure controller 36 that is connected to the internal volume of the vacuum tight enclosure via a port. The port is 100 mm in diameter and 5 cm in length. It will be appreciated that the internal volume and internal surface area of the vacuum tight enclosure may vary in accordance with the design requirements of the vacuum switch.

The pressure controller 36 includes a pumping apparatus and a venting apparatus.

The pumping apparatus includes a turbo-molecular pump (or any other pump) with a pumping speed of 1000 liters per second. In order to decrease the internal pressure of the vacuum tight enclosure, the pumping apparatus can be operated to selectively remove at least a portion of the gas from the vacuum tight enclosure. The pumping speed of a pumping apparatus may vary depending on the design requirements of the vacuum switch.

The venting apparatus includes a storage volume that contains 0.1 liters of the gas at a pressure level of 0.08 Torr. In order to increase the internal pressure of the vacuum tight enclosure, the venting apparatus can be operated to selectively introduce the gas into the vacuum tight enclosure by way of pressure equalisation with the storage volume through a 2 inch valve.

In the foregoing manner the pressure controller 36 is configured to control the internal pressure of the vacuum tight enclosure.

The pressure controller 36 is configured to selectively switch the internal pressure of the vacuum tight enclosure between a first vacuum level and a second vacuum level. The first vacuum level is set to be 0.01 Torr and to correspond to a Paschen minimum state of the gas. The second vacuum level is set to be less than $1\times10^{-3}$ Torr. It can be seen from FIG. 3 that the time taken for the pressure controller 36 to switch 38*a* the internal pressure of the vacuum tight enclosure from the second vacuum level to the first vacuum level is 2 ms, and the time taken for the pressure controller 36 to switch 38*b* the internal pressure of the vacuum tight enclosure from the first vacuum level to the second vacuum level is 7.5 ms.

It is envisaged that, in other embodiments of the invention, the venting apparatus may be replaced by a mass flow controller.

Operation of the vacuum switching assembly to switch a DC current is described as follows.

In use, the auxiliary electrode 24 is kept at a floating potential, whilst each of the first and second electrodes 20,22 is connected to a respective electrical circuit carrying a DC voltage. It will be appreciated that, in other embodiments of the invention, each of the first and second electrodes may be connected to a respective electrical circuit carrying an AC voltage, and accordingly the vacuum switching assembly may be operated to switch an AC current.

To turn on the vacuum switch, the pressure controller 36 switches the internal pressure of the vacuum tight enclosure from the second vacuum level to the first vacuum level. This increases the density of the gas in the vacuum tight enclosure to a level that permits formation of a glow discharge in the vacuum tight enclosure.

The glow discharge is then formed by passing a current through the gas so as to ionise the gas. More specifically, the first voltage controller selectively generates a differential voltage between one of the trigger electrodes 28 and the corresponding one of the first and second electrodes 20,22 so as to ionise the gas and thereby form the glow discharge in the vacuum tight enclosure.

Following formation of the glow discharge in the vacuum tight enclosure, the glow discharge spreads into the gaps between the sub-electrodes 20*a*, 22*a*, 24*a*, 24*b* in each interleaved radial array and across the surface of each sub-electrode 20*a*, 22*a*, 24*a*, 24*b*. This provides a path for current to flow between the first and auxiliary electrodes 20,24 and between the second and auxiliary electrodes 22,24, thus providing an effective path for current to flow between the first and second electrodes 20,22 via the auxiliary electrode 24 and glow discharge between the sub-electrodes 20*a*, 22*a*, 24*a*, 24*b* of the interleaved radial arrays. In this manner the vacuum switch is turned on. The pressure controller 36 controls the internal pressure of the vacuum tight enclosure to stay at the first vacuum level to permit maintenance of the glow discharge in the vacuum tight enclosure and thereby enable the vacuum switch to remain turned on.

The formation of the glow discharge in the vacuum tight enclosure using the first voltage controller enables the glow discharge to be initially formed in a central location relative to the sub-electrodes 20*a*, 22*a*, 24*a*, 24*b* of the interleaved radial arrays, thus facilitating a more uniform expansion of the glow discharge among the sub-electrodes 20*a*, 22*a*, 24*a*, 24*b* of the interleaved radial arrays. This in turn provides a more uniform path for current to flow between the first and second electrodes 20,22 and thereby results in dependable turn-on behaviour of the vacuum switch, thus improving the reliability of the vacuum switching assembly.

The configuration of each end portion 26 as set out above increases the surface area of the corresponding sub-electrode 20*a*, 22*a*, 24*a*, 24*b* in a manner that leads to more uniform distribution of the glow discharge across the surface of the sub-electrode 20*a*, 22*a*, 24*a*, 24*b* and of the current density across each interleaved radial array. This improves the current interrupting capability, high voltage withstand capability and dielectric recovery of the vacuum switch.

Since the first vacuum level corresponds to the Paschen minimum state of the gas, the dielectric strength between the first and second electrodes 20,22 is at its minimum when the vacuum switch is turned on. This enables the voltage drop across the first and second electrodes 20,22 to kept at a minimum and thereby minimise energy dissipation across the surfaces of the electrodes 20,22 while the vacuum switch is turned on.

It will be appreciated however that, in other embodiments of the invention, the pressure value of the first vacuum level may vary as long as it permits formation and maintenance of a glow discharge in the vacuum tight enclosure to allow a current to flow between the first and second electrodes via the auxiliary electrode and glow discharge between the sub-electrodes of the interleaved radial arrays.

The voltage drop across the first and second electrodes 20,22 during turn-on of the vacuum switch varies with the type of gas in the vacuum tight enclosure. Accordingly the gas may be selected to minimise a voltage that appears across the first and second electrodes 20,22 when the vacuum switch is turned on at the first vacuum level of the internal pressure of the vacuum tight enclosure.

To turn off the vacuum switch, the pressure controller 36 switches the internal pressure of the vacuum tight enclosure from the first vacuum level to the second vacuum level. This reduces the density of the gas in the vacuum tight enclosure to a level that inhibits maintenance of the glow discharge in the vacuum tight enclosure. Consequently the glow discharge in the gaps between the sub-electrodes 20*a*, 22*a*, 24*a*, 24*b* of the interleaved radial arrays is extinguished. This removes the path for current to flow between the first and auxiliary electrodes 20,24 and between the second and auxiliary electrodes 22,24, thus removing the effective path for current to flow between the first and second electrodes 20,22 via the auxiliary electrode 24 and glow discharge between the sub-electrodes 20*a*, 22*a*, 24*a*, 24*b* of the interleaved radial arrays. In this manner the vacuum switch is turned off. The pressure controller 36 controls the internal pressure of the vacuum tight enclosure at the second vacuum level to inhibit formation of a new glow discharge in the vacuum tight enclosure and thereby enable the vacuum switch to remain turned off.

The time taken to turn on the vacuum switch is the same as the time taken for the pressure controller 36 to switch the internal pressure of the vacuum tight enclosure from the second vacuum level to the first vacuum level, i.e. 2 ms. The time taken to turn off the vacuum switch is the same as the time taken for the pressure controller 36 to switch the internal pressure of the vacuum tight enclosure from the first vacuum level to the second vacuum level, i.e. 7.5 ms.

During the switching of the internal pressure of the vacuum tight enclosure from the second vacuum level to the first vacuum level, electrical breakdown between the first and second electrodes 20,22 may occur, thereby resulting in formation of an electrical breakdown-induced arc discharge that could damage or modify the surfaces of the electrodes 20, 22, 24.

In order to avoid formation of the electrical breakdown-induced arc discharge, the second voltage controller may be further configured to selectively generate a differential voltage between one of the trigger electrodes 28 and the corresponding one of the first and second electrodes 20,22 so as to ionise the gas and thereby form the glow discharge in the vacuum tight enclosure prior to the internal pressure of the vacuum tight enclosure reaching a vacuum level that permits formation of an electrical breakdown-induced arc discharge, when the internal pressure of the vacuum tight enclosure is switched from the second vacuum level to the first vacuum level. This ensures that the switching of the internal pressure of the vacuum tight enclosure from the second vacuum level to the first vacuum level does not result in formation of an electrical breakdown-induced arc discharge.

Optionally the pressure controller 36 may be configured to selectively vary the rate of change of the internal gas pressure of the vacuum tight enclosure between the first and second vacuum levels so as to vary the rate of turn-on or turn-off of the vacuum switch. This allows the pressure controller 36 to not only control the rate of change of recovery voltage across the first and second electrodes 20,22, but also control the rate of change of the internal gas pressure of the vacuum tight enclosure between the first and second vacuum levels to inhibit generation of voltage transients, thus obviating the need for the addition of a surge arrester to handle any voltage transient.

Further optionally the pressure controller 36 may be configured to vary the internal pressure of the vacuum tight enclosure within a range of vacuum levels, each of which permits formation and maintenance of a glow discharge in the vacuum tight enclosure to allow a current to flow between the first and second electrodes 20,22 via the auxiliary electrode 24 and glow discharge between the sub-electrodes 20*a*, 22*a*, 24*a*, 24*b* of the interleaved radial arrays, while the vacuum switch is turned on. This allows the pressure controller 36 to not only actively vary the current density in the vacuum switch, but also actively vary the voltage across the first and second electrodes 20,22, thus enabling the vacuum switch to be operated as a power flow controller to control the rate of change of current in the electrical circuits connected to the first and second electrodes.

The use of the glow discharge as a path for current to flow between the electrodes 20, 22, 24 is beneficial in that it obviates the need for a metal vapour arc between the electrodes 20, 22, 24 and thereby avoids the occurrence of anode spot activity that could lead to electrode surface erosion, melting, a reduced breakdown voltage between the electrodes 20, 22, 24, dielectric failure and failure of the vacuum switch to recover successfully after a current zero.

The inclusion of the pressure controller 36 in the vacuum switch therefore results in a vacuum switching assembly that is capable of switching AC and DC currents without the use of moving electrodes and without the need for a metal vapour arc between the electrodes 20, 22, 24, thus obviating the earlier-mentioned problems associated with electrode separation during switching. The vacuum switching assembly according to the invention may form part of a power switching apparatus.

It is envisaged that, in other embodiments of the invention, the second vacuum level may have a higher pressure value than the first vacuum level as long as the second vacuum level inhibits formation and maintenance of a glow discharge in the vacuum tight enclosure to prevent a current from flowing between the first and second electrodes via the glow discharge.

When the vacuum switch is required to switch a high current, the resultant magnetic force acting on the electrodes may become strong enough to cause deformation of the electrodes 20, 22, 24. It is envisaged that, in other embodiments of the invention, each electrode may include at least one structural reinforcement element arranged to inhibit deformation of the electrode caused by a magnetic force induced by a magnetic field generated during flow of current in the electrode. For example, the or each structural reinforcement element in each electrode may be a non-magnetic steel insert placed inside the electrode, preferably along its longitudinal axis, or may be a steel tube joined (e.g. brazed) to a support structure that is associated with the electrode and extends outside the vacuum tight enclosure.

Optionally the vacuum switching assembly may further include a magnetic field generator (not shown) in the form of a solenoid. The solenoid is located outside the vacuum tight enclosure, and is arranged with respect to the vacuum tight enclosure to enable the solenoid to generate a magnetic field with a magnetic field direction that is transverse to an electric field direction in the glow discharge.

The generation of a magnetic field with a magnetic field direction that is transverse to an electric field direction in the glow discharge assists the rise in voltage of the glow discharge. Thus, application of the magnetic field at the instant of a current zero in the vacuum switch speeds up dielectric recovery subsequent to the turn-off of the vacuum switch.

It is envisaged that, in other embodiments of the invention, the first and second electrodes may be shaped and arranged to define any one of:

a pair of cylindrically concentric electrodes;

a pair of parallel plate electrodes;

a pair of spherically concentric electrodes.

It is also envisaged that, in other embodiments of the invention, either or each of the first and second electrodes may be configured to be capable of movement in order to increase or decrease the gap between the first and second electrodes, even though turn-on and turn-off of the vacuum switch does not require movement of the first and second electrodes.

It is further envisaged that, in other embodiments of the invention, the vacuum switch may further include a second voltage controller configured to selectively generate a differential voltage between the first and second electrodes so as to ionise the gas and thereby form the glow discharge in the vacuum tight enclosure.

The number and arrangement of vacuum switches in the vacuum switching assembly may vary, depending on the design requirements of the vacuum switching assembly. The vacuum switching assembly may, for example, include a plurality of series-connected and/or parallel-connected vacuum switches. Multiple vacuum switches may be connected to define different configurations of the vacuum switching assembly in order to vary its operating voltage and current characteristics to match the requirements of the associated power application.

While the vacuum switch is turned on, the voltage drop across the first and second electrodes 20,22 results in generation of heat losses that distribute rapidly via the glow discharge to components of the vacuum switch. The vacuum switch further includes a heat exchanger (not shown) through which the gas may be circulated to remove these heat losses and thereby maintain the temperature of the vacuum switch within permissible limits.

A power switching apparatus 40 for switching a DC current according to a second embodiment of the invention is shown in FIG. 4.

The power switching apparatus 40 comprises a vacuum switching assembly 42 and a mechanical switching assembly 44. The mechanical switching assembly 42 is connected in parallel with the vacuum switching assembly 44 between a pair of terminals 46,48. In use, each of the terminals 46,48 are connected to a respective electrical circuit carrying a DC voltage. It will be appreciated that, in other embodiments of the invention, each of the terminals may be connected to a respective electrical circuit carrying an AC voltage, and accordingly the power switching apparatus may be operated to switch an AC current.

The vacuum switching assembly 42 of the power switching apparatus 40 is similar in structure and operation to the vacuum switching assembly of FIG. 1, and like features share the same reference numerals.

The mechanical switching assembly 44 includes a mechanical switch.

In use, during normal operation of the electrical circuits, the vacuum switch in the vacuum switching assembly 42 is turned off while the mechanical switch in the mechanical switching assembly 44 is closed to conduct a current flowing between the two terminals 46,48. This not only results in an overall reduction in heat losses in comparison to the vacuum switching assembly 42, but also obviates the need for the aforementioned heat exchanger.

The power switching apparatus 40 is turned off as follows. Initially the mechanical switch is opened. Once a sufficiently large arc voltage has developed in the mechanical switch, the vacuum switch is turned on to divert the current from the mechanical switching assembly 44 to the vacuum switching assembly 42, thereby extinguishing the arc in the mechanical switch and fully opening the mechanical switch with full dielectric recovery. The vacuum switch is then turned off to complete the turn-off of the power switching apparatus 40.

The power switching apparatus 40 is turned on as follows. Initially the vacuum switch is turned on. The mechanical switch is then closed. Once the mechanical switch is fully closed and thereby carrying the current flowing between the terminals 46,48, the vacuum switch is turned off to complete the turn-on of the power switching apparatus 40.

The invention claimed is:

1. A vacuum switching assembly for switching an AC or DC current, the vacuum switching assembly comprising a vacuum switch, the vacuum switch including:

first and second electrodes located in a vacuum tight enclosure, the vacuum tight enclosure containing a gas or gas mixture, the first and second electrodes defining opposed electrodes being separated by a gap, each of the first and second electrodes being connectable to a respective electrical circuit carrying an AC or DC voltage; and a pressure controller configured to control an internal pressure of the vacuum tight enclosure, wherein the pressure controller is configured to selectively switch the internal pressure of the vacuum tight enclosure between:

a first vacuum level that permits formation and maintenance of a glow discharge in the vacuum tight enclosure to allow a current to flow between the first and second electrodes via the glow discharge so as to turn on the vacuum switch; and a second vacuum level that inhibits formation and maintenance of a glow discharge in the vacuum tight enclosure to prevent a current from flowing between the first and second electrodes via the glow discharge so as to turn off the vacuum switch.

2. A vacuum switching assembly according to claim 1 wherein the second vacuum level has a lower or higher pressure value than the first vacuum level.

3. A vacuum switching assembly according to claim 1 wherein the pressure controller includes at least one of: a pumping apparatus configured to selectively remove at least a portion of the gas or gas mixture from the vacuum tight enclosure; or a venting apparatus or mass flow controller configured to selectively introduce a gas or gas mixture into the vacuum tight enclosure.

4. A vacuum switching assembly according to claim 1 wherein the vacuum switch further includes at least one of: a first trigger electrode spaced apart from the first electrode; or a second trigger electrode spaced apart from the second electrode, and wherein the vacuum switch further includes a first voltage controller configured to control a voltage of at least one of the first trigger electrode or the second trigger electrode, the first voltage controller being configured to selectively generate a differential voltage between at least one of the first trigger electrode or the second trigger electrode and a corresponding one of the first and second electrodes so as to ionise the gas or gas mixture and thereby form the glow discharge in the vacuum tight enclosure.

5. A vacuum switching assembly according to claim 4 wherein the first voltage controller is further configured to selectively generate a differential voltage between at least one of the first trigger electrode or the second trigger electrode and a corresponding one of the first and second electrodes so as to ionise the gas or gas mixture and thereby form the glow discharge in the vacuum tight enclosure prior to the internal pressure of the vacuum tight enclosure reaching a vacuum level that permits formation of an electrical breakdown-induced arc discharge, when the internal pressure of the vacuum tight enclosure is switched from the second vacuum level to the first vacuum level.

6. A vacuum switching assembly according to claim 4, wherein the first electrode includes a plurality of first elongate sub-electrodes, the second electrode includes a plurality of second elongate sub-electrodes, and the vacuum switch further includes an auxiliary electrode arranged between and spaced apart from the first and second electrodes inside the vacuum tight enclosure, the auxiliary electrode including a plurality of third elongate sub-electrodes and a plurality of fourth elongate sub-electrodes, each sub-electrode extending parallel with a longitudinal axis extending through the first and second electrodes, each plurality of elongate sub-electrodes being radially arranged about the longitudinal axis extending through the first and second electrodes, each first elongate sub-electrode being arranged between and spaced apart from two third elongate sub-electrodes to define an interleaved radial array of alternating first and third elongate sub-electrodes, each second elongate sub-electrode being arranged between and spaced apart from two fourth elongate sub-electrodes to define an interleaved radial array of alternating second and fourth elongate sub-electrodes, and wherein either or each of the first and second electrodes includes a tubular elongate sub-electrode coaxially arranged with the longitudinal axis extending through the first and second electrodes, the tubular elongate sub-electrode being configured to house the corresponding at least one of the first trigger electrode or the second trigger electrode and to be spaced apart from the corresponding at least one of the first trigger electrode or the second trigger electrode.

7. A vacuum switching assembly according to claim 1 wherein the vacuum switch further includes a second voltage controller configured to selectively generate a differential voltage between the first and second electrodes so as to ionise the gas or gas mixture and thereby form the glow discharge in the vacuum tight enclosure.

8. A vacuum switching assembly according to claim 1 wherein the first vacuum level is at least one of: in a range of 0.01 to 0.1 Torr; or corresponds to a Paschen minimum state of the gas or gas mixture.

9. A vacuum switching assembly according to claim 1 wherein the gas or gas mixture is selected to minimise a voltage that appears across the first and second electrodes when the vacuum switch is turned on at the first vacuum level of the internal pressure of the vacuum tight enclosure.

10. A vacuum switching assembly according to claim 1 wherein the pressure controller is configured to selectively vary a rate of change of an internal gas pressure of the vacuum tight enclosure between the first and second vacuum levels so as to vary a rate of turn-on or turn-off of the vacuum switch.

11. A vacuum switching assembly according to claim 1 wherein the pressure controller is configured to vary the internal pressure of the vacuum tight enclosure within a range of vacuum levels, each of which permits formation and maintenance of a glow discharge in the vacuum tight enclosure to allow a current to flow between the first and second electrodes via the glow discharge, while the vacuum switch is turned on.

12. A vacuum switching assembly according to claim 1 wherein the first and second electrodes are separated by a fixed gap.

13. A vacuum switching assembly according to claim 1 wherein the first and second electrodes are shaped and arranged to define any one of:

a pair of cylindrically concentric electrodes;

a pair of parallel plate electrodes;

a pair of spherically concentric electrodes.

14. A vacuum switching assembly according to claim 13 wherein each elongate sub-electrode includes a rod portion and an end portion located at a free end of the rod portion, each end portion being shaped to be partially or wholly spherical, each end portion having a larger diameter than the corresponding rod portion.

15. A vacuum switching assembly according to claim 13 wherein at least part of each elongate sub-electrode is coated with, attached to, or joined to refractory material.

16. A vacuum switching assembly according to claim 1 wherein the first electrode includes a plurality of first elongate sub-electrodes, the second electrode includes a plurality of second elongate sub-electrodes, and the vacuum switch further includes an auxiliary electrode arranged between and spaced apart from the first and second electrodes inside the vacuum tight enclosure, the auxiliary electrode including a plurality of third elongate sub-electrodes and a plurality of fourth elongate sub-electrodes, each sub-electrode extending parallelly with a longitudinal axis extending through the first and second electrodes, each plurality of elongate sub-electrodes being radially arranged about the longitudinal axis extending through the first and second electrodes, each first elongate sub-electrode being arranged between and spaced apart from two third elongate sub-electrodes to define an interleaved radial array of alternating first and third elongate sub-electrodes, each second elongate sub-electrode being arranged between and spaced apart from two fourth elongate sub-electrodes to define an interleaved radial array of alternating second and fourth elongate sub-electrodes.

17. A vacuum switching assembly according to claim 1 wherein each electrode includes at least one structural reinforcement element arranged to inhibit deformation of the electrode caused by a magnetic force induced by a magnetic field generated during flow of current in the electrode.

18. A vacuum switching assembly according to claim 1 further including a magnetic field generator located outside the vacuum tight enclosure, the magnetic field generator being arranged with respect to the vacuum tight enclosure to enable the magnetic field generator to generate a magnetic field with a magnetic field direction that is transverse to an electric field direction in the glow discharge.

19. A vacuum switching assembly according to claim 1 including at least one of: a plurality of series-connected vacuum switches; or a plurality of parallel-connected vacuum switches.

20. A power switching apparatus for switching an AC or DC current, the power switching apparatus comprising:

a vacuum switching assembly according to claim 1; and a mechanical switching assembly connected in parallel with the vacuum switching assembly between a pair of terminals, each of the terminals being connectable to a respective electrical circuit carrying an AC or DC voltage, the mechanical switching assembly including at least one mechanical switch.

* * * * *